United States Patent
Benoit et al.

(10) Patent No.: US 7,325,943 B2
(45) Date of Patent: Feb. 5, 2008

(54) ELECTROLUMINESCENT PANEL WHICH IS EQUIPPED WITH LIGHT EXTRACTION ELEMENTS

(75) Inventors: Pascal Benoit, Rennes (FR); Christophe Fery, Rennes (FR); Gunther Haas, Rennes (FR)

(73) Assignee: Thomson Licensing, Boulogne-Billancourt (FR)

( * ) Notice: Subject to any disclaimer, the term of this patent is extended or adjusted under 35 U.S.C. 154(b) by 0 days.

(21) Appl. No.: 10/505,527

(22) PCT Filed: Jan. 30, 2003

(86) PCT No.: PCT/FR03/00278

§ 371 (c)(1), (2), (4) Date: Aug. 23, 2004

(87) PCT Pub. No.: WO03/073525

PCT Pub. Date: Sep. 4, 2003

(65) Prior Publication Data

US 2005/0253788 A1    Nov. 17, 2005

(30) Foreign Application Priority Data

Feb. 27, 2002  (FR)  .................................. 02 02476

(51) Int. Cl.
*F21V 7/00*     (2006.01)

(52) U.S. Cl. ........................ 362/247; 362/241; 362/84; 313/505; 313/506; 313/507

(58) Field of Classification Search .................. 362/84, 362/241, 247, 555, 560; 313/505–507
See application file for complete search history.

(56) References Cited

U.S. PATENT DOCUMENTS

| 4,387,961 A | 6/1983 | Winston |
| 6,046,543 A | 4/2000 | Bulovic et al. |
| 6,091,384 A | 7/2000 | Kubota et al. |
| 6,229,160 B1 | 5/2001 | Krames et al. |

FOREIGN PATENT DOCUMENTS

| DE | 20116022 | 2/2002 |
| JP | 57-018376 | 1/1982 |
| JP | 2001-71558 | 3/2001 |

OTHER PUBLICATIONS

W.T. Welford et al., "High Collection Nonimaging Optics", Chaptr 4, pp. 53-75.
Search Report Dated Jul. 7, 2003.

*Primary Examiner*—Stephen F Husar
*Assistant Examiner*—Meghan K. Dunwiddie
(74) *Attorney, Agent, or Firm*—Joseph J. Laks; Harvey D. Fried; Patricia Verlangieri

(57) ABSTRACT

An image-display panel is described. The panel includes a one-dimensional or two-dimensional matrix of organic electroluminescent cells deposited on a substrate and grouped together in rows or columns. Light extraction elements are deposited on each row or column of cells to form an extraction layer.

7 Claims, 12 Drawing Sheets

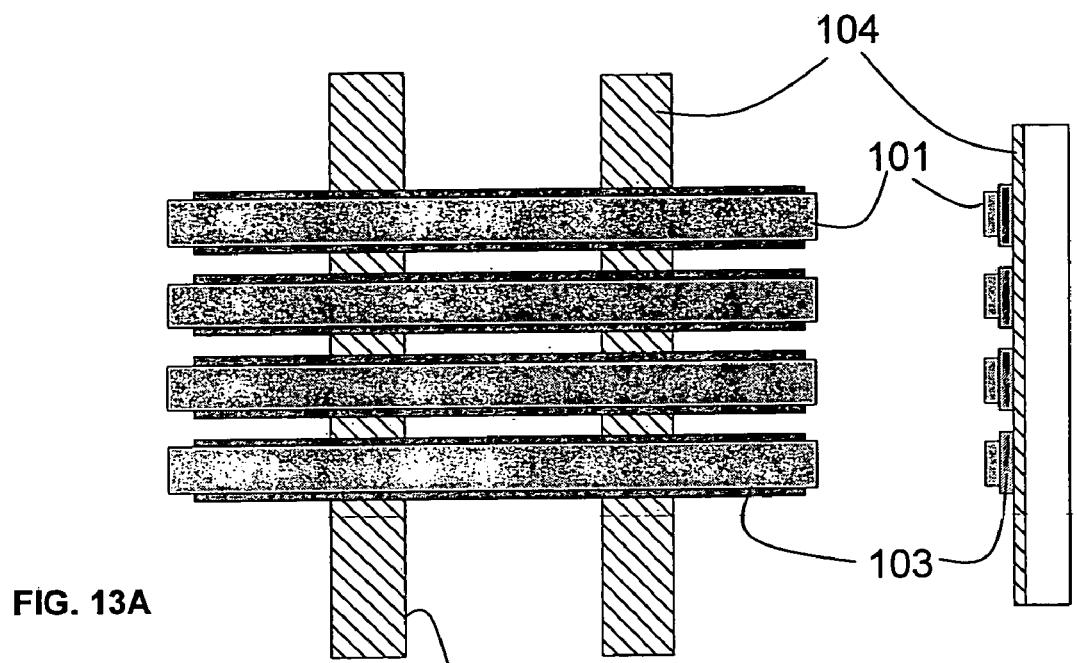
FIG. 13A
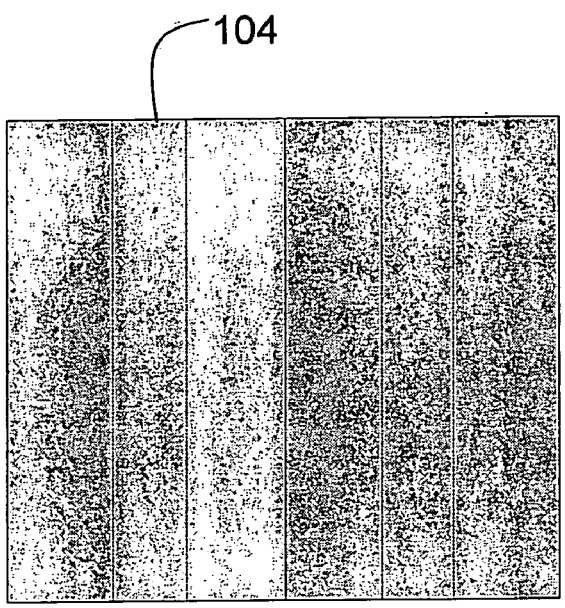
FIG. 13B
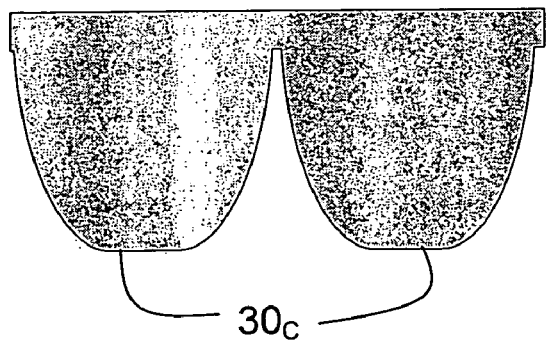

ELECTROLUMINESCENT PANEL WHICH IS EQUIPPED WITH LIGHT EXTRACTION ELEMENTS

This application claims the benefit, under 35 U.S.C. §365 of International Application PCT/FR03/00278, filed Jan. 30, 2003, which was published in accordance with PCT Article 21(2) on Sep. 4, 2003 in French and which claims the benefit of French patent application No. 0202476, filed Feb. 27, 2002.

The invention relates to an illumination or image-display panel comprising a one-dimensional or two-dimensional matrix of organic light-emitting cells (or OLEDs) which is provided with means for making it easier to extract the light emitted by these cells, which means considerably improve the luminous efficiency thereof.

Such a panel generally comprises a substrate that supports a thin organic electroluminescent layer inserted between two arrays of electrodes, one being an array of anodes and the other an array of cathodes, which are intended to supply the cells; each cell is positioned in a region of overlap between an anode and a cathode; in the case of a passive-matrix panel, each array is generally formed from electrodes in the form of parallel bands of constant width; the electrodes of the anode array are generally perpendicular to the electrodes of the cathode array; for polychromatic, especially trichromatic, panels, the thin organic electroluminescent layer is generally divided into alternating bands of different emission colors.

In the case of active-matrix panels, the substrate incorporates electronic components for driving the cells, in the case of a passive-matrix panel, the substrate is generally made of glass or plastic; the thickness of the substrate is generally between 300 μm and 1500 μm, i.e. 500 to 100 times greater than that of the cells; the dimension or the diameter of the cells or pixels is generally between 100 μm and 300 μm, i.e. 1 to 15 times smaller than the thickness of the substrate; the layer of electrodes inserted between the substrate and the electroluminescent layer is generally called the "lower layer" since, in conventional fabrication processes, it is applied before the electroluminescent layer; the other layer of electrodes, which is applied after the electroluminescent layer, is called the "upper layer"; in general, the bands of the upper layer of electrodes are parallel to and centered on those of the electroluminescent layer, which they at least partly cover.

Depending on the case, the light emitted by the panel has to pass through the substrate in order for the images to be displayed to reach the observer (in the case of "back-emitting" panels), or does not have to pass through the substrate in order to reach him (in the case of "top-emitting" panels).

In general, the light emitted by the panel must pass through one of the electrode layers, either the lower layer (in the case of back-emitting panels) or the upper layer (in the case of top-emitting panels), before exiting via the exit face of the panel where it enters the air in the direction of the observer; the other layer is then generally reflective in order to recover the light from the cells that is emitted in the opposite direction to that of the observer and to redirect it toward the outside of the panel via the exit face of the panel.

One of the electrode layers is thus generally transparent, for example based on ITO in order to serve as anode, the other then preferably being made of metal, which is absorbent or even reflective.

The large index difference between the electroluminescent emitting layer and the air considerably limits the level of light extraction; this is because any ray reaching the interfaces between the emitting layer and the air at an angle of incidence greater than the critical angle of refraction (or angle of total reflection) is totally reflected within the panel and generally lost.

To limit these losses, documents JP10-223367, WO 01/33598 equivalent to U.S. 2002-0118271, and JP11-354271 teach how to apply, on the exit face of OLED-type panels, arrays of lenses that are used to extract light:
either one spherical lens per cell or one cylindrical lens per row of cells;
or many microlenses per cell.

The light extraction systems described in those documents are based on the refraction of the light at the exit of the cells, more precisely in the form of the exit face of the panel, which has a suitable curvature so that the rays emanating from the cells reach this face at an angle of incidence smaller than the critical angle of refraction so as to pass through it.

Other documents, such as U.S. Pat. No. 6,091,384 and U.S. Pat. No. 6,229,160 propose light extraction systems applied to electroluminescent panels of the LED or OLED type.

It is an object of the invention in particular to propose another extraction solution based no longer on the refraction of rays emanating from the cells, but essentially on their reflection.

The invention relates to an illumination or image-display panel comprising a one-dimensional or two-dimensional matrix of organic electroluminescent cells deposited on a substrate and grouped at least into rows, characterized in that it comprises, for each cell or group of cells, an optical light extraction element which itself comprises:
an entry interface optically coupled with the emissive surface of said cell or cells of the group or that of the substrate so as to capture the rays emitted by said cell or cells;
an exit interface, the shape of which has a suitable curvature so that the rays that emanate from this entry interface strike said exit interface at an angle of incidence smaller than the critical angle of refraction at this exit interface so as to pass through it; and
optionally, an intermediate reflective surface that has a suitable curvature so that the rays emanating from the entry interface that strike said intermediate reflective surface are sent toward the exit interface so as to have there an angle of incidence smaller than the critical angle of refraction at this exit interface in order to pass through it.

In summary, each optical light extraction element of the panel comprises:
an entry interface optically coupled with the emissive surface of the cells or that of the substrate of the panel, so as to capture the rays emitted by these cells;
an exit interface of suitable shape so that the rays emitted by the cells pass through it; and
optionally, a reflective surface that modifies the path of these rays so as to reduce the angle of incidence at this exit interface.

In the case of a two-dimensional matrix of cells, these are also grouped in columns; there therefore may be one optical extraction element per column.

Preferably, the optical coupling with the cells or with the substrate is provided by a layer of adhesive having a refractive index comparable to that of the material of the optical elements.

The material of the optical extraction elements is transparent; this is chosen, for example, from a conventional soda-lime glass of 1.52 index, a polymethyl methacrylate of 1.49 index or a polyethylene glycol terephthalate of 1.57 index; since this material has a refractive index higher than that of air and closer to that of the electroluminescent emitting layer, the rays emitted by a cell of the panel, after they have passed through the entry interface of an extraction element, lie within a solid angle greater than the solid angle in which they would lie after having passed through an interface of identical shape, but with air, which means that this optical element captures a proportion of the radiation emitted by the cells that is greater than which would reach the air directly via these cells in the absence of the optical extraction elements; thus, the optical elements increase the level of light extraction considerably.

According to the invention, the optical element is specially designed so that almost all of the rays that penetrate the entry interface emerge via the exit interface, either by the orientation of these rays being modified, especially by reflection, so that they have an angle of incidence smaller than the critical angle of refraction at the exit interface, especially if this interface is planar and parallel to the surface of the substrate;

or by the shape of the exit interface being adapted, especially by it being given a convex shape, so that the angle of incidence of these rays at this interface is smaller than the critical angle of refraction at this interface;

or by using both these means simultaneously.

The use of these means implies that, for each optical extraction element, the area of its exit interface is greater than that of its entry interface; this arrangement allows the distance between the edges of the emissive regions of various cells or pixels to be increased, this being particularly advantageous, especially in the case of active-matrix panels; this point will be developed later.

Preferably, for each extraction element, the exit interface if there is no reflective surface, or, where appropriate, said reflective surface, does not have a planar surface element; this is because the non planar curved surfaces are the best suited for obtaining the highest level of light extraction; if the extraction elements have reflective surfaces, the invention therefore extends to the cases in which the exit interfaces are planar, in accordance with most of the examples given below.

In a first family of embodiments of extraction elements, the latter form an array of convex microlenses.

The shape of the convex lens of the exit interface is particularly well suited for the rays emanating from the entry interface to make, with this interface, an angle of incidence smaller than if this interface were planar and parallel to the substrate of the panel; by reducing the angle of incidence at the interface with the air, the level of light extraction is very considerably increased.

The area of each microlens is greater than the area of an emitting region or of a pixel of the panel.

There may be one microlens per cell, in which case each microlens has two planes of symmetry, the intersection of which is preferably centered on a cell, or one microlens per row or per column of cells, in which case each microlens has a plane of symmetry that is preferably centered on a row of cells or a column of cells.

The subject of the invention is an illumination or image-display panel as defined in the claims below, in which the extraction elements have a reflective surface; this reflective surface has a suitable shape so that any ray penetrating the entry interface of an extraction element emerges therefrom via the exit interface of this element.

The shape of the exit interface of each optical extraction element may be plane or curved; this shape has a suitable curvature so that the rays that emanate from the entry interface, directly or via one or more reflections on the reflective surface, strike this exit interface at an angle of incidence smaller than the critical angle of refraction at this exit interface so as to pass through it.

According to this second family of embodiments of extraction elements in which the extraction elements have a reflective surface, this surface preferably has a suitable shape so that any ray penetrating via the entry interface of an extraction element emerges therefrom via the exit interface; this condition is expressed as the "edge-ray" principle, referring in particular to Chapter 4, paragraph 2 of the work entitled "*High Collection Nonimaging Optics*", by W. T. Welford & R. Winston, Academic Press, Inc. 1989, page 54; preferably, the reflective surface has at least one plane of symmetry and each of the two lines of intersection of this surface with a plane perpendicular to this plane of symmetry forms a portion of a parabola, as illustrated in Chapter 4, paragraph 3 of that work, especially in FIG. 4.3, in which, unlike the invention, such a surface is used as a concentrator; the entry face of the concentrator described in that work becomes the exit interface of the extraction element according to the invention and the exit face of the concentrator becomes the entry interface; as illustrated in Chapter 4, paragraph 5 of this same work, each of the two lines of intersection forms a succession of portions of parabolas; preferably, the position of the axis and the focus of the parabola of each line of intersection, and also the thickness L of the extraction element, are chosen so as to satisfy the conditions set out in Chapter 4, paragraph 3 of that work, especially on pages 56–57, so as to satisfy the "edge-ray" principle; to recapitulate, each of the two lines of intersection preferably defines the reflective surface in accordance with what is called a CPC (Compound Parabolic Concentrator), as defined in this same work.

Thanks to the optical extraction elements operating by reflection according to the invention, it is possible to extract a very high proportion of the light emitted by the cells and panels with a high luminous efficiency are obtained.

Other shapes of reflective surfaces may be used without departing from the invention, such as conical shapes or paraboloidal shapes in which the two lines of intersection mentioned above would have the same axis.

The reflective surface therefore forms a reflector; there may be one reflector per cell, in which case each reflector preferably has two planes of symmetry, that are generally perpendicular, the intersection of which passes through the center of a cell; there may be one reflector per row or column of cells, in which case each reflector has a single plane of symmetry centered on a row or on a column.

The invention also applies to cases in which each extraction element has both a lens-shaped exit interface and a reflective surface; preferably, this reflective surface is then of the CPC type described above, examples of such elements are given in Chapter 5, paragraph 8 of the abovementioned work.

In a variant, the extraction element also serves to collimate the light; for each extraction element, the exit interface and/or, where appropriate, the reflective surface then have a suitable shape so that the rays exiting the exit interface lie within a solid angle strictly less than $2\pi$ steradians; the shape of the exit interface and/or that of the reflective surface are then advantageously suitable for the rays emitted by the panel to be restricted in the direction of a limited region of the space especially intended for the observers of the images to be displayed; the efficiency of the panel is therefore appreciably improved at no further cost.

Preferably, the optical extraction elements of the panel make up a single part forming an extraction layer.

This part then brings together all the lenses or parabolic reflectors or other light extraction elements; this arrangement is particularly advantageous because it is inexpensive both as regards the manufacture of the extraction elements and their assembly on the panel, since all the extraction elements are suitably positioned on the various cells of the panel in a single operation; furthermore, the extraction layer can then be used for protecting the cells of the panel, especially against the action of ambient water and/or oxygen.

If the extraction elements are made of plastic, this single part can then be produced very inexpensively by conventional plastics conversion methods, such as compression molding or injection molding.

In general, the matrix of cells comprises an electroluminescent layer placed between two layers of electrode arrays, one called the "lower" layer on the side facing the substrate and one called the "upper" layer on the other side, each cell being positioned in a region of overlap between an electrode of the lower layer and an electrode of the upper layer; such a panel may include other electrode arrays, especially in the case of active-matrix panels.

When the electrode or electrodes of the upper layer are transparent or semitransparent, the panel is then said to be a "top-emitting" panel; the extraction elements are then positioned on top of this upper layer; preferably, the extraction elements, according to the first or second family of embodiments, make up a single part, form an extraction layer and also form an encapsulation layer that is sealed with respect to the substrate so as to prevent the penetration of gases, such as oxygen or water vapor, into the cells and so as to prevent any risk of the electroluminescent layer being damaged by these gases; the space thus encapsulated may include adsorbent agents or desiccants, capable of adsorbing these gases.

Preferably, this desiccant is then placed in cavities that are made in the thickness of the extraction layer, which cavities are open to the inside of the panel in the direction of the electroluminescent layer and are placed between the extraction elements so that the adsorbent agent does not impede the passage of the light.

When the electrodes of the lower layer are transparent or semitransparent, the panel is then said to be a "back-emitting" panel; the extraction elements are then positioned on the opposite face of the substrate from that of this lower layer.

Preferably, it is then the extraction layer itself that forms the substrate of the panel; as regards the manufacture of the panel, it is then on the extraction layer, on the entry interface side, that the various layers, in particular the layer of electrodes and the layer of electroluminescent material, are deposited, which layers constitute the two-dimensional matrix of cells of the panel; the extraction layer is then preferably made of glass.

According to a variant of the invention, the substrate has a fibrous structure, the fibers of which are suitable and oriented for guiding the light from one face of said substrate to the other.

The entry interface of each extraction element may cover a group of cells, especially a row of cells, or for example a column of cells if the matrix is two-dimensional; in this case, each extraction element preferably has a plane of symmetry centered on this group of cells, row or column.

Preferably, each cell of this group emits in the same primary color; in other words, each group of cells then corresponds to cells emitting in the same color.

The entry interface of each extraction element may on the other hand cover a single cell; in this case, each extraction element preferably has two planes of symmetry, the intersection of which passes through the center of this cell; in the case of a panel with a two-dimensional matrix of cells, the extraction elements then form a two-dimensional array.

In a variant of the invention, the surface density of extraction elements may be greater than the surface density of groups of cells or cells of the panel.

In the case of passive-matrix panels, the electrodes of the arrays preferably are in the form of parallel conducting bands of constant width; preferably, the electroluminescent layer is then divided into parallel bands emitting different primary colors and arranged in an alternating fashion; preferably, each electrode band of the upper layer is then parallel to and centered on a band of the electroluminescent layer.

However, the invention is particularly advantageous in the case in which the substrate of the panel forms an active matrix; this is because, in order to integrate an active matrix into electroluminescent panels, it is often necessary to limit the area of electroluminescent emission specific to each cell; this limitation is no longer a drawback when light extraction elements according to the invention are used.

Finally, the invention applies most particularly to image-display panels.

The invention will be more clearly understood on reading the description that follows, given by way of non-limiting example and with reference to the appended figures in which.

Figure 5:
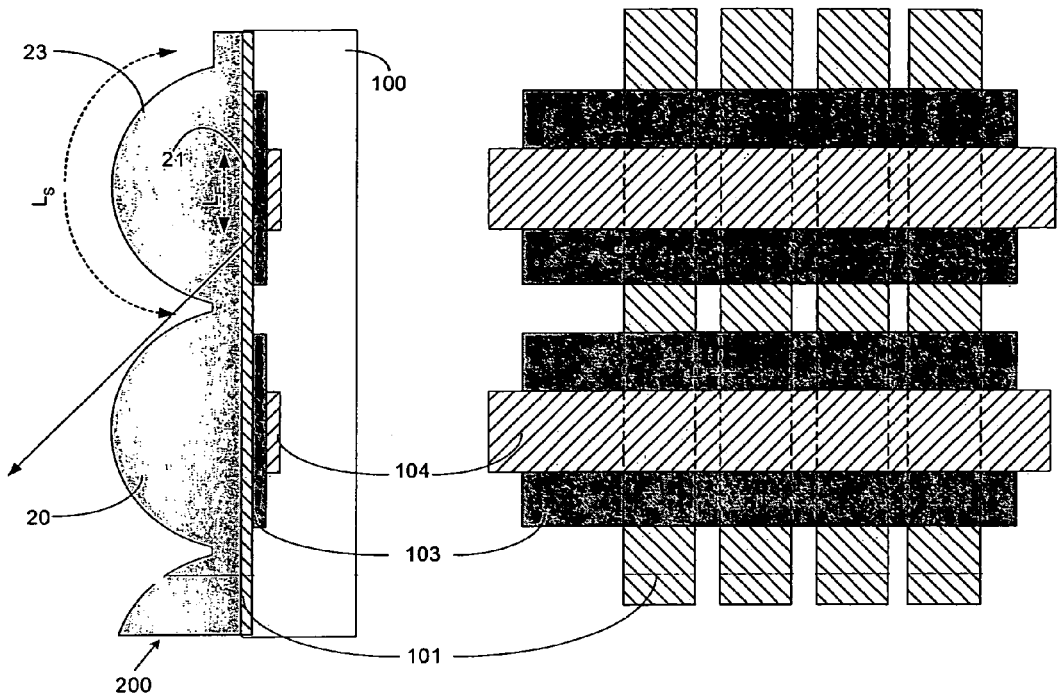
Figure 6:
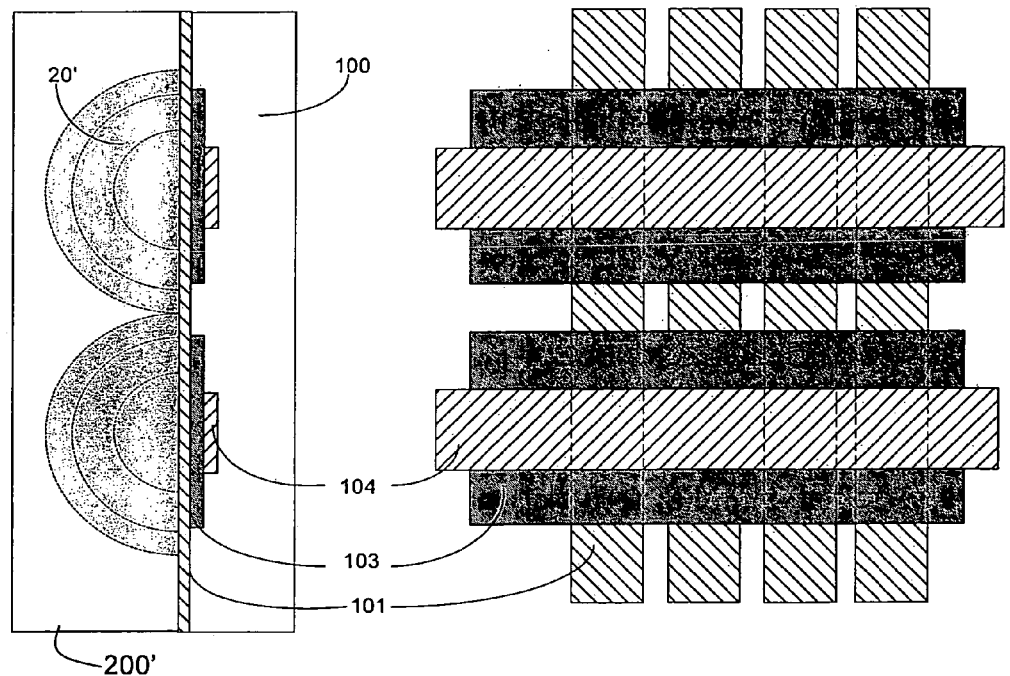
Figure 10:
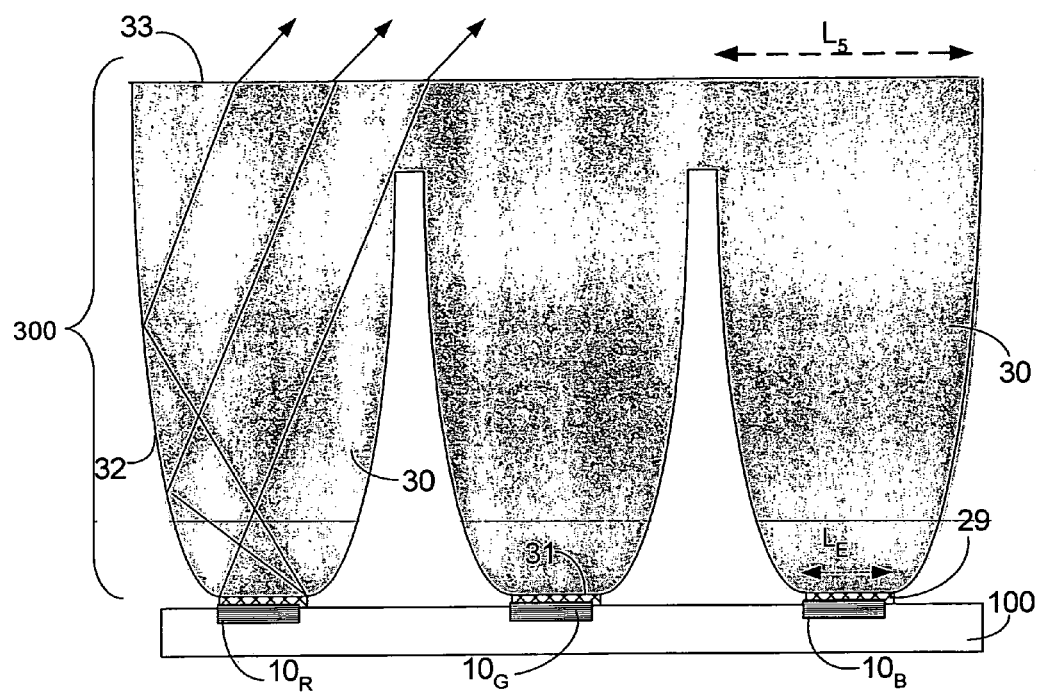
Figure 11:
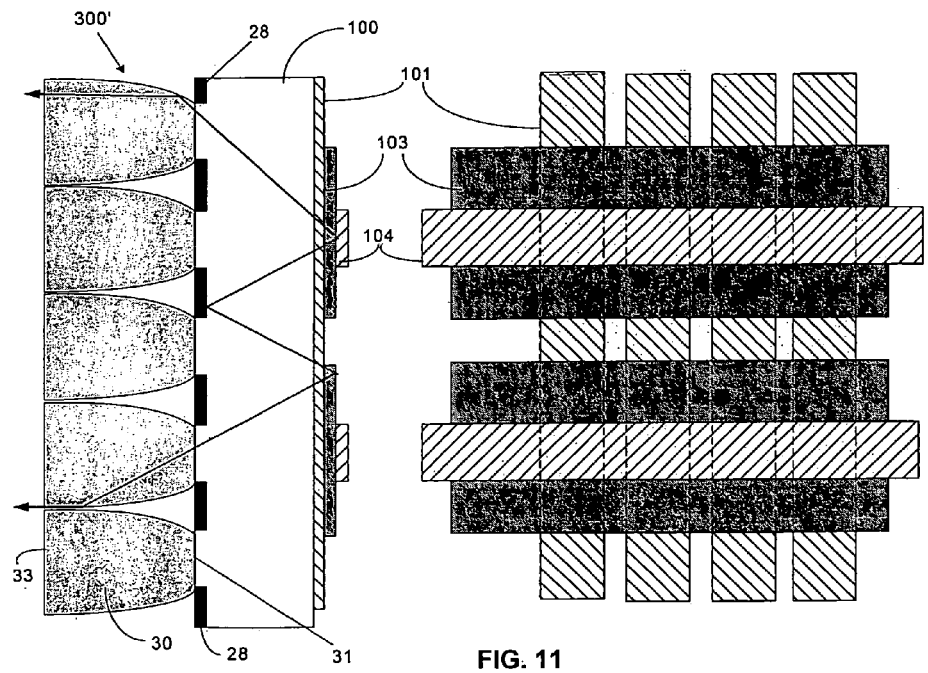
Figure 15:
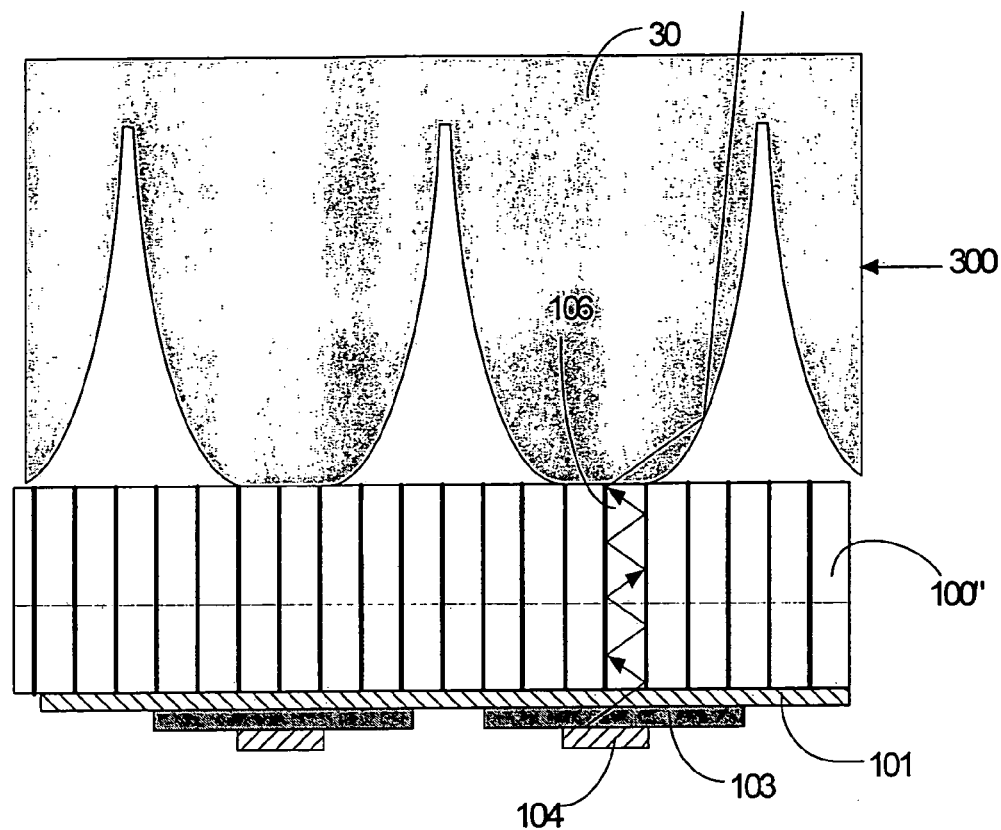
Figure 16:
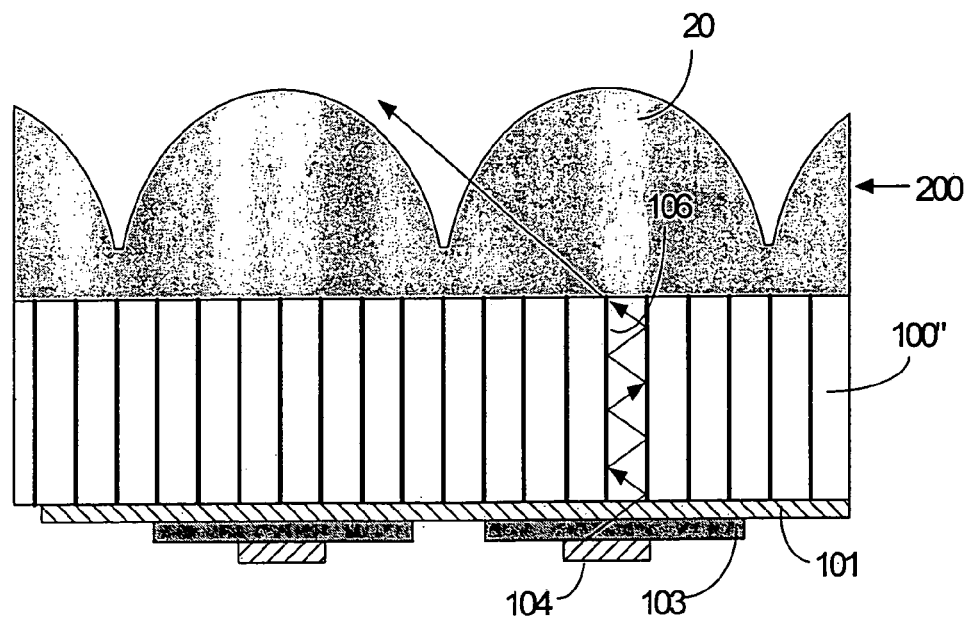
Figure 17:
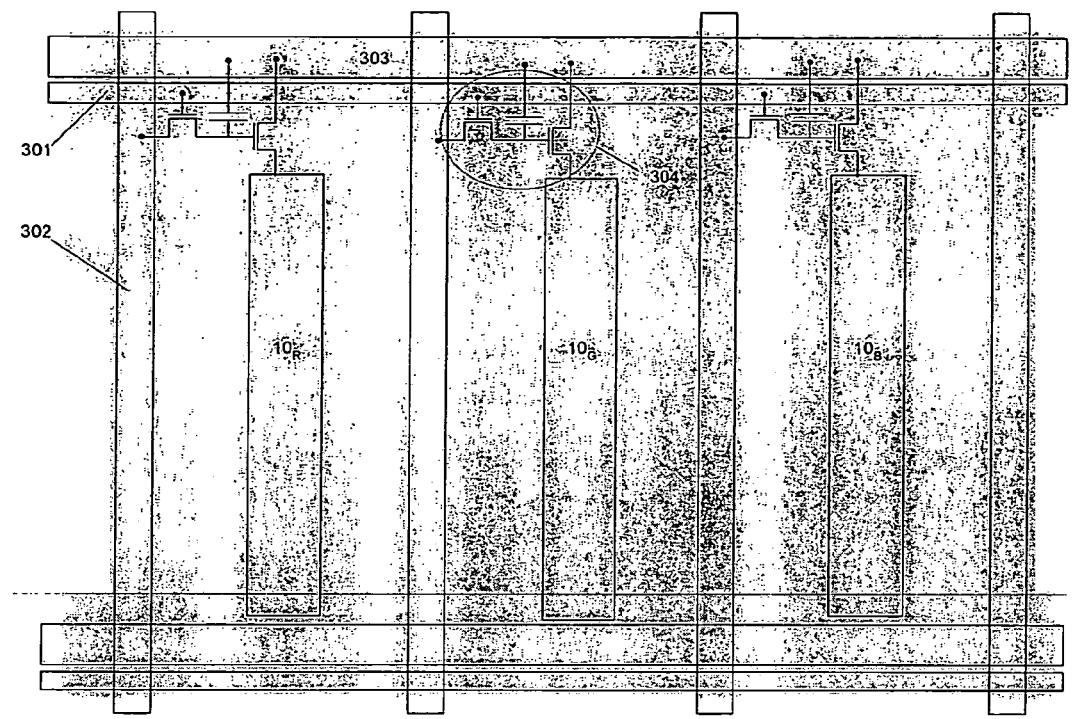

FIGS. 5 to 9 illustrate, in side or sectional view and in back or front view, top-emitting panels without barriers with, in a first family of embodiments in which the light extraction elements are in the form of microlenses: the generic case in FIG. 5; the case in which a graded-index plate is used as extraction layer in FIG. 6; the case of longitudinal lenses placed parallel to the rows or to the columns, in FIG. 7 and FIG. 8 respectively; and the case of an extraction layer formed from a two-dimensional matrix of lenses in FIG. 9;

FIG. 11 illustrates, in cross section, a back-emitting electroluminescent panel without barriers, which is provided with light extraction elements in the form of reflectors according to a second family of embodiments of light extraction elements;

FIGS. 10 and 12 to 14 illustrate, in side or sectional view and in back or front view, top-emitting panels without barriers and with light extraction elements in the form of reflectors according to the second family of embodiments: the generic case in FIG. 10; the case of longitudinal reflectors placed parallel to the rows or columns respectively in FIGS. 12 and 13; and the case of an extraction layer formed from a two-dimensional matrix of reflectors in FIG. 14;

FIGS. 15 and 16 illustrate sectional views of back-emitting electroluminescent panels, the substrates of which are made up from fibers serving as light guides in order to pass through them, these being provided with reflectors and microlenses respectively; and FIG. 17 illustrates a top view of an active-matrix electroluminescent panel before application of a light extraction layer.

To simplify the description and to bring out the differences and advantages afforded by the invention compared with the prior art, identical reference numerals will be used for the elements that fulfill the same functions.

The panel according to the invention therefore comprises:
- a two-dimensional matrix of organic electroluminescent cells deposited on a substrate and grouped together in rows or columns; and
- light extraction elements deposited on each cell or row or column of cells, forming an extraction layer.

The manufacture of the panel, in this case a passive-matrix panel, excluding the extraction layer specific to the invention, will firstly be described with reference to FIGS. 1 to 4.

Various conventional methods may be used to deposit in succession, on a substrate, a lower layer of electrodes in the form of an array, an electroluminescent layer comprising in general alternating bands that emit different colors, and an upper layer of electrodes in the form of an array: it is possible to use, for example, photolithography, vacuum deposition with a shadow mask, spin coating deposition and/or ink-jet printing.

As was seen above, two types of panel may be distinguished: namely those, which are the more common, which are back-emitting i.e. the light passes through the substrate and therefore through the lower layer of electrodes, and those that are top-emitting, i.e. the light passes through the upper layer of electrodes.

For each of these types, two types of structure are conventionally possible, namely a structure with separating barriers between the bands of the upper layer of electrodes and that of the electroluminescent layer, and a structure without separating barriers; the latter structure is generally produced by deposition methods using a shadow mask.

The advantage of separating barriers is that they provide better electrical isolation between the rows or columns of cells; their drawback is that they entail additional cost.

In general, four panel types are therefore encountered, which will now be described separately in greater detail.

Figure 1:
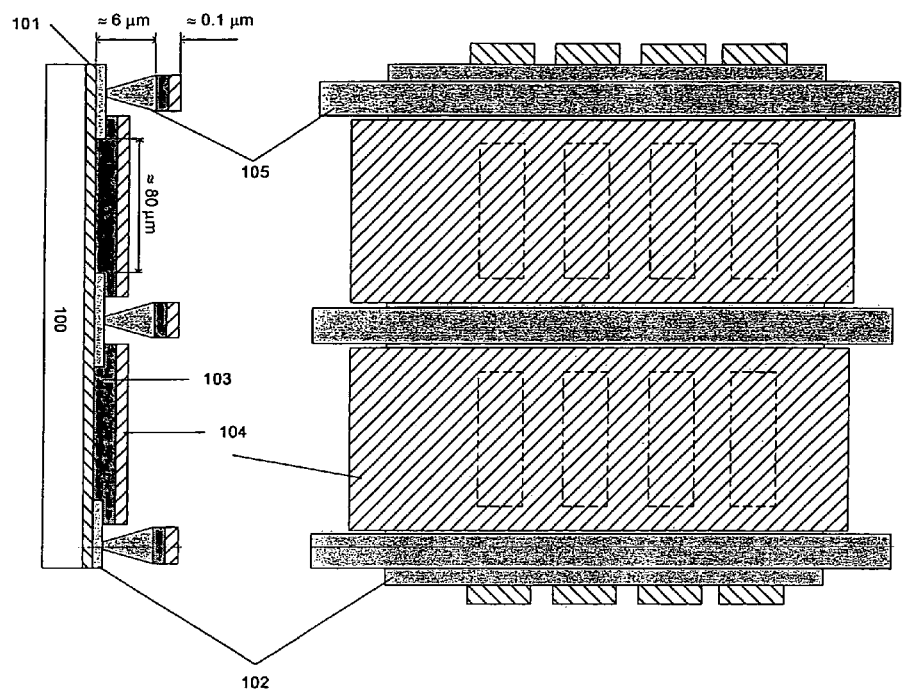
FIGS. 1 and 2 illustrate back-emitting electroluminescent panels, with barriers and without barriers respectively, before application of a light extraction layer according to the invention.

In the case of a back-emitting panel provided with barriers, FIG. 1 shows a substrate 100, formed by a glass plate, on which a transparent lower layer based on ITO (indium tin oxide) is deposited, which is then etched to form bands of transparent electrodes 101; in the case of an active matrix, rectangles of transparent electrodes would instead be etched; next, an electrical isolation layer 102 is deposited, leaving spaces or gaps, in this case rectangular in shape, for each electroluminescent cell; an array of linear separating barriers 105, that are parallel and oriented perpendicular to the electrodes 101 of the lower layer, these being placed between the gaps or spaces in the isolation layer 102; possible methods for producing the barriers are described in document U.S. Pat. No. 5,701,055 (PIONEER); these barriers are made of insulating material, preferably identical to that of the isolation layer 102; deposited between the barriers 105 and within each gap or space in the isolation layer 102 is the organic electroluminescent layer forming bands 103, said layer itself being generally structured in the form of several sublayers comprising especially an organic hole-injection sublayer, an organic electroluminescent sublayer proper and an electron-injection sublayer; to deposit these organic sublayers, a vacuum process is used for example; to obtain alternating bands of different colors, each color is deposited by masking the inter-barrier regions corresponding to the other colors; next, bands of electrodes 104, which are generally opaque and preferably reflective, are then deposited on top of the electroluminescent bands 103; here again, these bands may be structured in the form of several sublayers, for example a sublayer based on lithium fluoride (LIF) and a sublayer based on aluminum, which provides the reflective effect; in this way a back-emitting panel provided with barriers is obtained.

Figure 2:
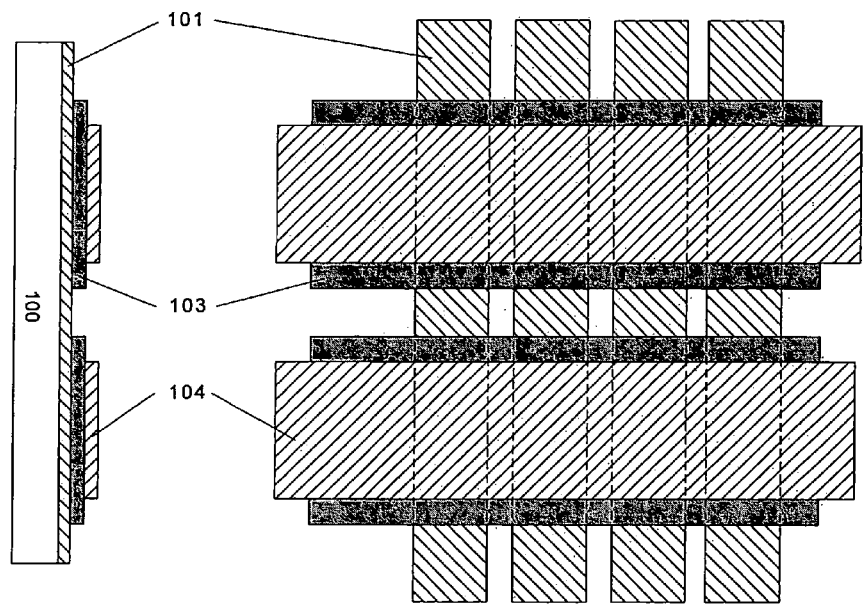

In the case of a back-emitting panel without barriers, FIG. 2 shows a substrate 100 formed by a glass sheet on which, as previously, bands of transparent electrodes 101 are deposited; bands 103 of organic electroluminescent layers, with a structure and composition that are identical to those described above, are deposited using a mask or a set of masks—one for each color; these bands 103 are parallel, oriented perpendicular to the electrodes 101 of the lower layer and are arranged so as to cover the rectangular regions of the cells; next, bands of electrodes 104 identical to the previous ones are deposited, through the masks having narrower apertures on top of the electroluminescent bands 103; in this way, a back-emitting panel without barriers is obtained.

Figure 3:
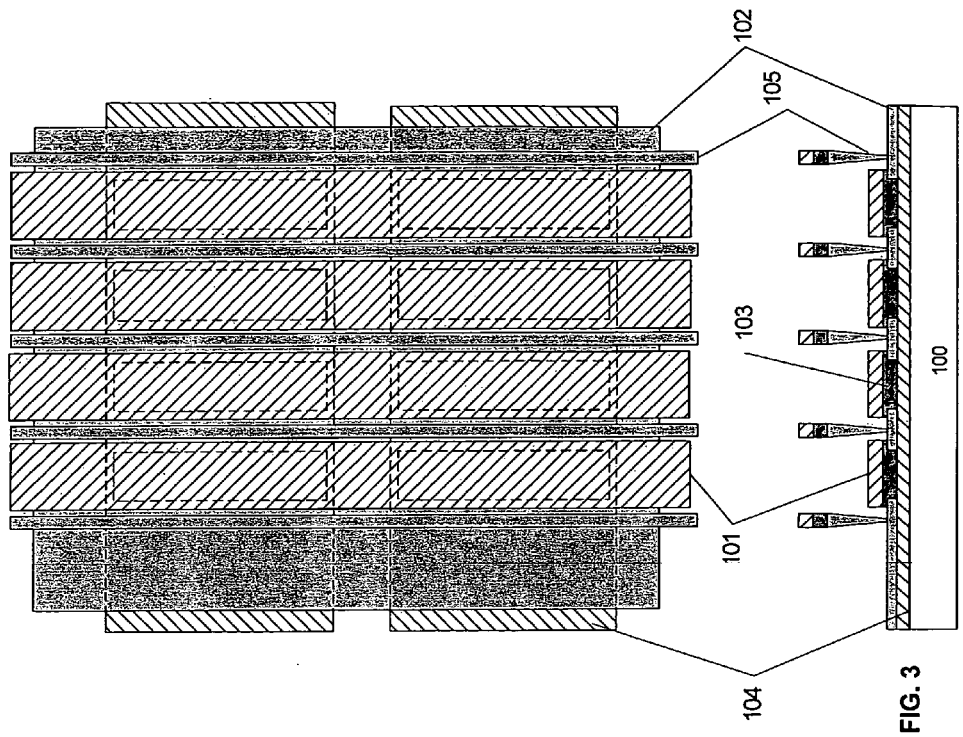
FIGS. 3 and 4 illustrate top-emitting electroluminescent panels, with barriers and without barriers respectively, before application of a light extraction layer according to the invention.

In the case of a top-emitting panel provided with barriers and with reference to FIG. 3, the process used is as in the case already described of a back-emitting panel provided with barriers, in which the position of the transparent electrodes 101, which now belong to the upper layer, and the position of the opaque electrodes 104, which now belong to the lower layer, are reversed.

Figure 4:
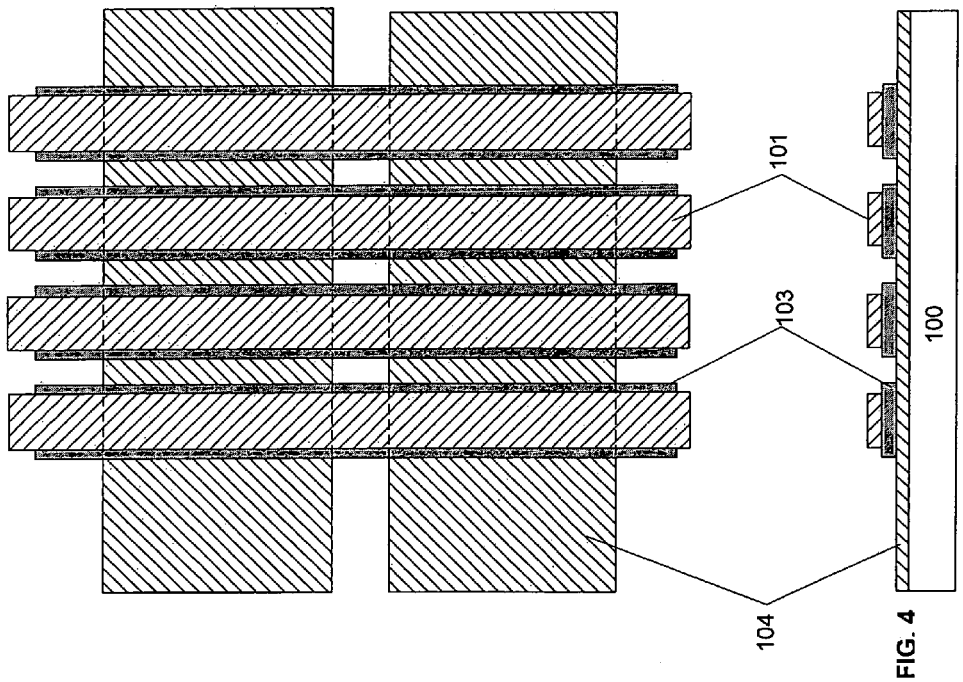

In the case of a top-emitting panel without barriers and with reference to FIG. 4, the process used is as in the case already described of a back-emitting panel without barriers, in which the position of the transparent electrodes 101, Which now belong to the upper layer, and the position of the opaque electrodes 104, which now belong to the lower layer, are reversed.

Other conventional processes for obtaining a two-dimensional matrix of organic electroluminescent cells may be used without departing from the invention, especially in the case of active matrices.

Two large families of light extraction elements will now be described, by way of example, these being deposited on each cell or on each row or column of cells:
- extraction elements of the microlens 20 type;
- extraction elements of the parabolic reflector 30 type.

FIG. 5 illustrates extraction elements in the form of microlenses 20 deposited on a top-emitting electroluminescent panel without barriers, as described above with reference to FIG. 4; each microlens 20 comprises, at each cell, or each row or column of cells, of the panel:
- an entry interface 21 of aperture $L_E$ optically coupled with the emissive surface of this cell or of the cells of this row or this column, so as to capture the emitted rays emanating from the electroluminescent layer 103 through the transparent electrodes 101; and
- an exit interface 23 of wider aperture $L_S$, the shape of which has a suitable curvature so that the rays that emanate from the entry interface 21, like that shown by the solid arrow in the figure, strike this exit interface 23 at an angle of incidence smaller than the critical angle of refraction at this exit interface 23 so as to pass through it.

Thanks to such a lenticular element 20, the extraction of the light emitted by the cells of the panel is considerably improved.

Preferably, the set of extraction elements makes up a single part and forms an extraction layer 200; this extraction layer may be made of a transparent polymer material, which allows it to be formed inexpensively by compression molding or injection molding; this extraction layer may also be made of glass; this extraction layer may be joined to the panel by adhesive bonding; the layer of intermediate adhesive (not shown) then serves as means of optical coupling with the panel.

FIG. 6 shows a variant in which the extraction layer 200' has a uniform thickness and contains graded-index regions 20', which act in the same way as the optical extraction elements described above.

Figure 7B:
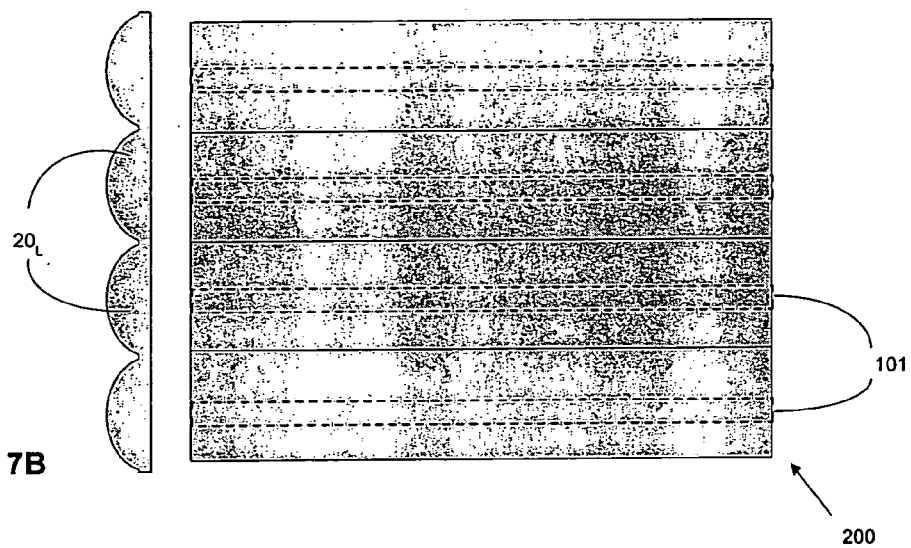
Figure 7A:
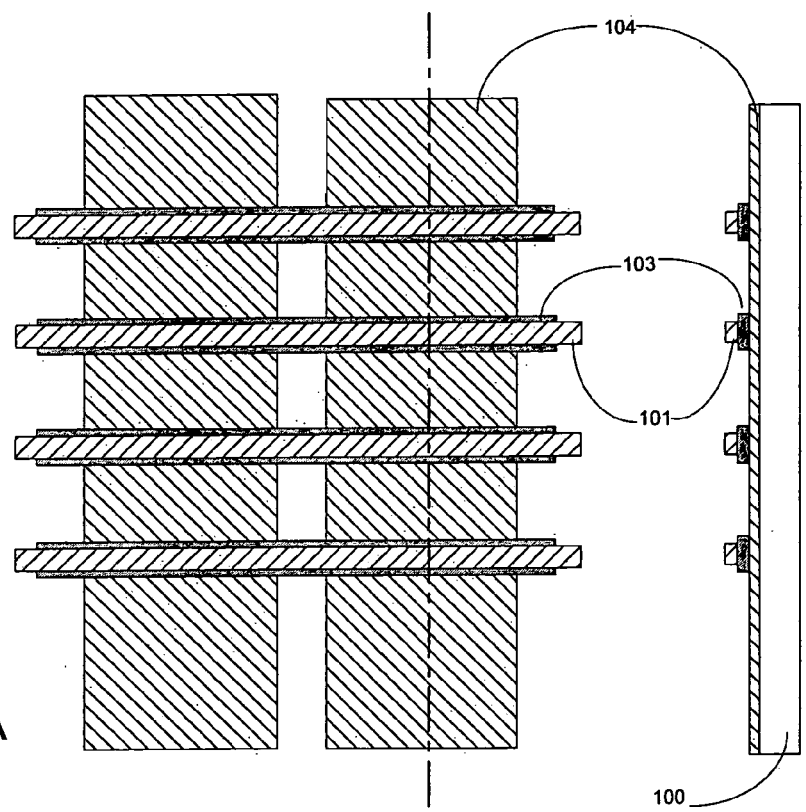
Figures 8A, 8B:
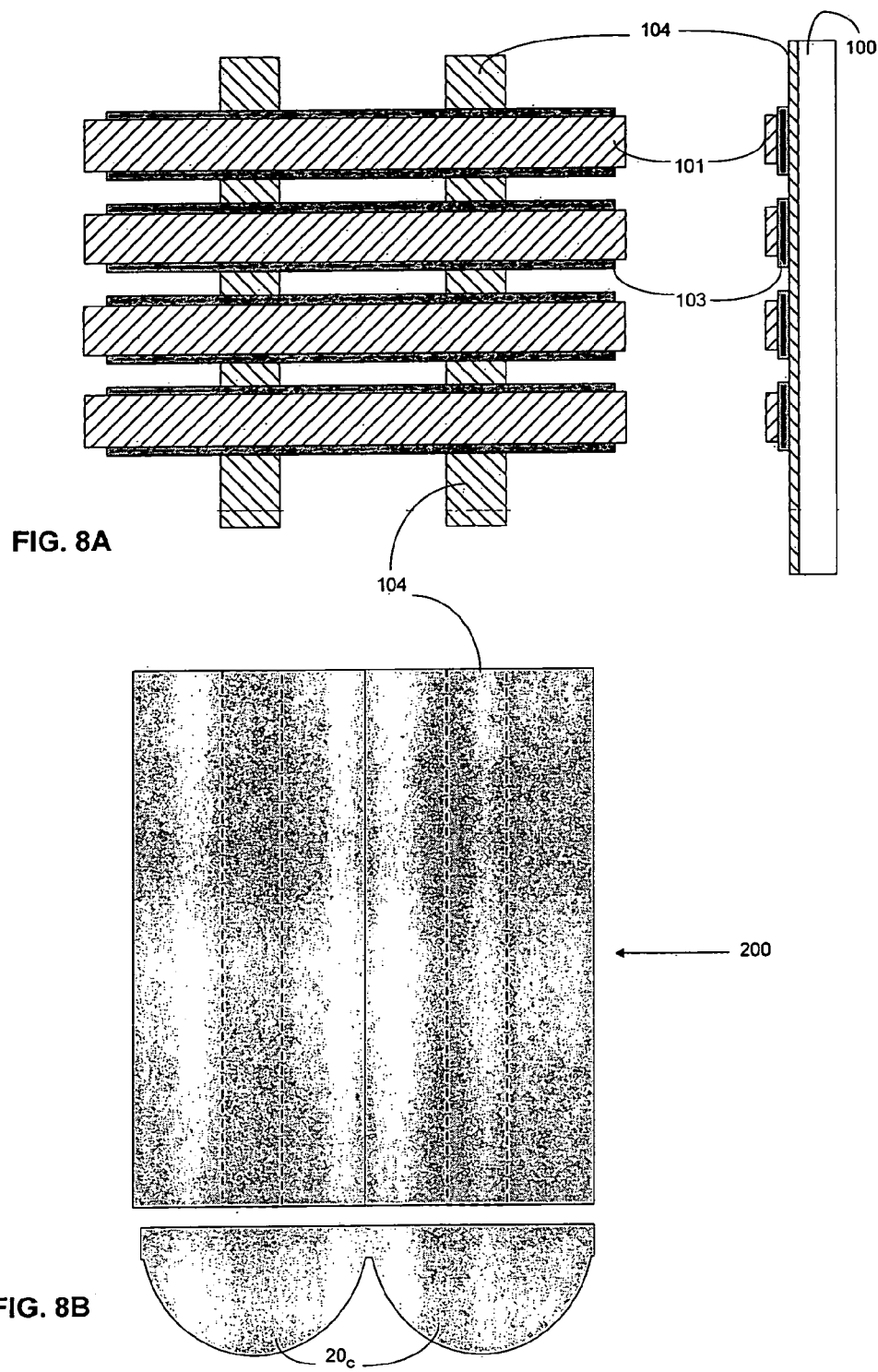
Figure 9A:
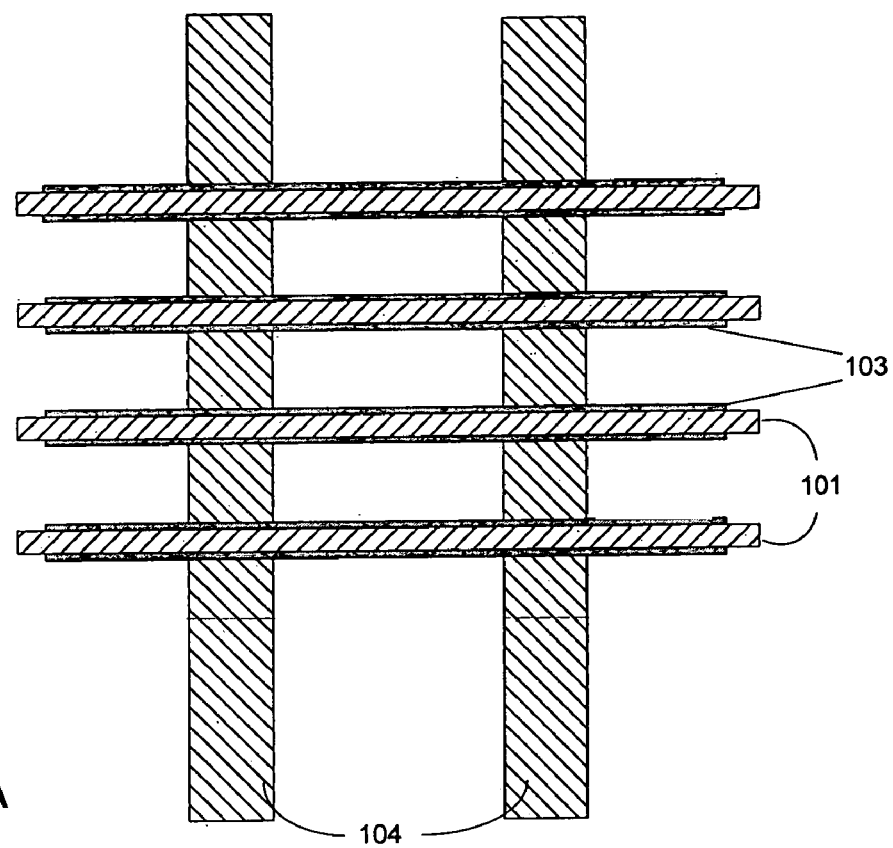
Figure 9B:
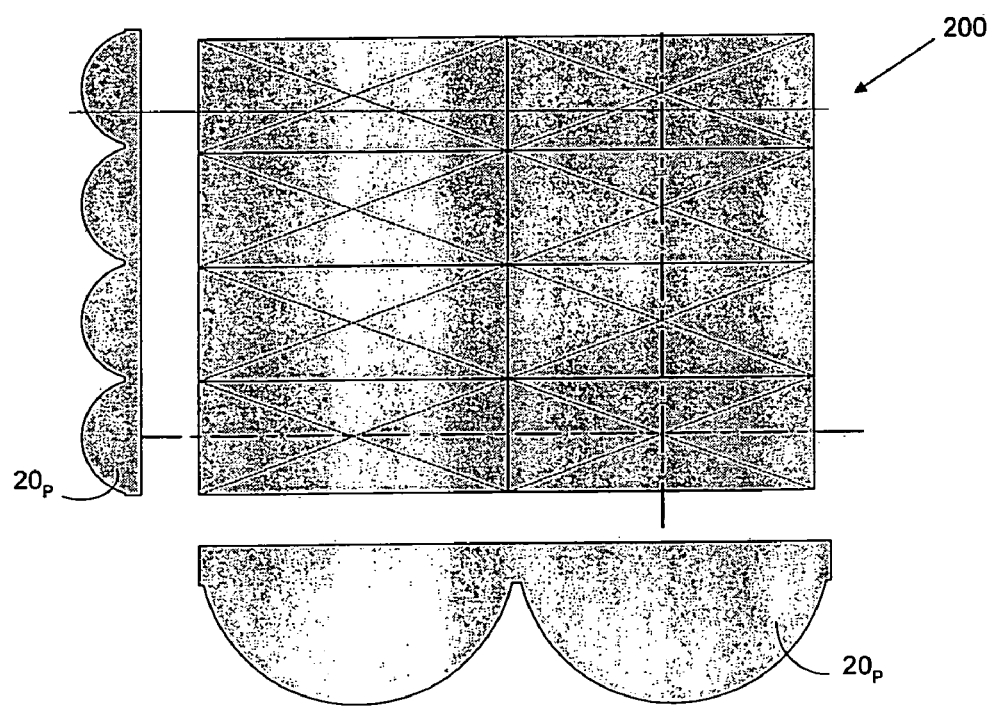

FIGS. 7 to 9 present other variants relating to the shape of the microlenses of the extraction elements:

FIG. 7B: each extraction element $20_L$ has a plane of symmetry, serves as a row of cells of the panel of FIG. 7A and is centered on a transparent electrode row 101 of this panel;

FIG. 8B: each extraction element $20_C$ has a plane of symmetry, serves as a column of cells of the panel of FIG. 8A and is centered on an opaque electrode column 104 of this panel; and FIG. 9B: each extraction element $20_P$ has an axis of symmetry centered on a cell of the panel at the intersection of a transparent row electrode 101 with an opaque column electrode 104 of the panel of FIG. 9A, and serves essentially for this cell.

These embodiments in which the extraction elements are in the form of microlenses also apply to back-emitting electroluminescent panels without barriers, such as those described above with reference to FIG. 2; the extraction layer 200 is then optically coupled with the surface of the substrate 100; because of the thickness of the substrate, which is generally between 0.3 and 1.5 mm and which is greater, or even much greater, than the dimension or diameter of the cells or pixels, the amount of light captured by the extraction layer is smaller than in the previous cases of top-emitting panels; this drawback is avoided by using the extraction layer 200 as substrate, preferably then using a graded-index extraction layer 200' as shown in FIG. 6.

The thickness of the extraction elements in the form of microlenses or of the extraction layer is a compromise between the level of light extraction, the desired level of concentration or collimation (see below), the mechanical strength and the desired level of protection with which the panel is desired to be provided.

FIG. 10 describes extraction elements in the form of parabolic reflectors 30 of the "CPC" type described above, deposited on a top-emitting electroluminescent panel without barriers as described above with reference to FIG. 4.

Each parabolic reflector 30 comprises, at each cell, or each row or column of cells, of the panel:

an entry interface 31 of aperture $L_E$ optically coupled with the emissive surface of this cell $10_R$, $10_G$, $10_B$, or of the cells of this row or of this column, so as to capture the emitted rays emanating from this or these cells;

a reflective surface 32 that has a suitable curvature so that the rays emanating from the entry interface 31 that strike said reflective surface are sent toward an exit interface 33 so as to have there an angle of incidence smaller than the critical angle of refraction at this exit interface in order to pass through it, an exit interface 33 of wider aperture $L_S$, whose form is plane in this case.

The rays emanating from the entry interface 31, such as those represented by solid arrows in FIG. 10, strike this exit interface 33 at an angle of incidence lower than the critical angle of refraction at this exit interface 33, in order to pass through it.

Preferably, the set of extraction elements makes a single piece and forms an extraction layer 300; preferably, this extraction layer is made of a transparent polymer material and is formed by compression molding or by injection molding.

Preferably, the reflective surfaces 32 are formed by aluminizing the regions of the surface of this layer that have to be reflective; in a variant, reflection is provided by total reflection.

The optical coupling at the entry interfaces is achieved using a layer of transparent adhesive with an index close to that of the material; however, by coating the entry interfaces 33 of the extraction layer with adhesive, there is a risk of applying adhesive to the reflective surfaces 32, which would be particularly deleterious if the reflection were to be provided by total reflection; aluminizing the reflective surfaces 32 avoids this drawback.

Thanks to such a reflector element 30, the extraction of the light emitted by the cells of the panel is considerably improved.

FIG. 11 shows a variant in which the extraction layer 300' comprising reflectors 30 identical to the previous ones is deposited on a back-emitting electroluminescent panel without barriers as previously described with reference to FIG. 2; this variant also differs in that the density of extraction elements is much higher than previously—there are in fact twice the number of extraction elements as those of cells or columns of cells, or even of cells; this variant also differs in that it includes an array of reflector elements 28 placed between the substrate 100 and the extraction layer 300', between the entry interfaces 31 of adjacent extraction elements; this array of reflector elements 28 makes it possible to further improve the extraction efficiency, as indicated by the path of the light rays shown in the figure.

Figure 12B:
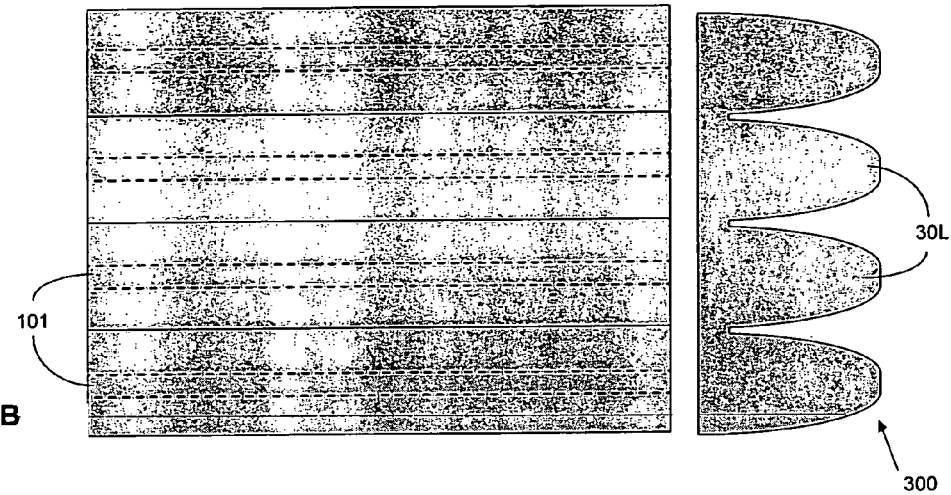
Figure 12A:
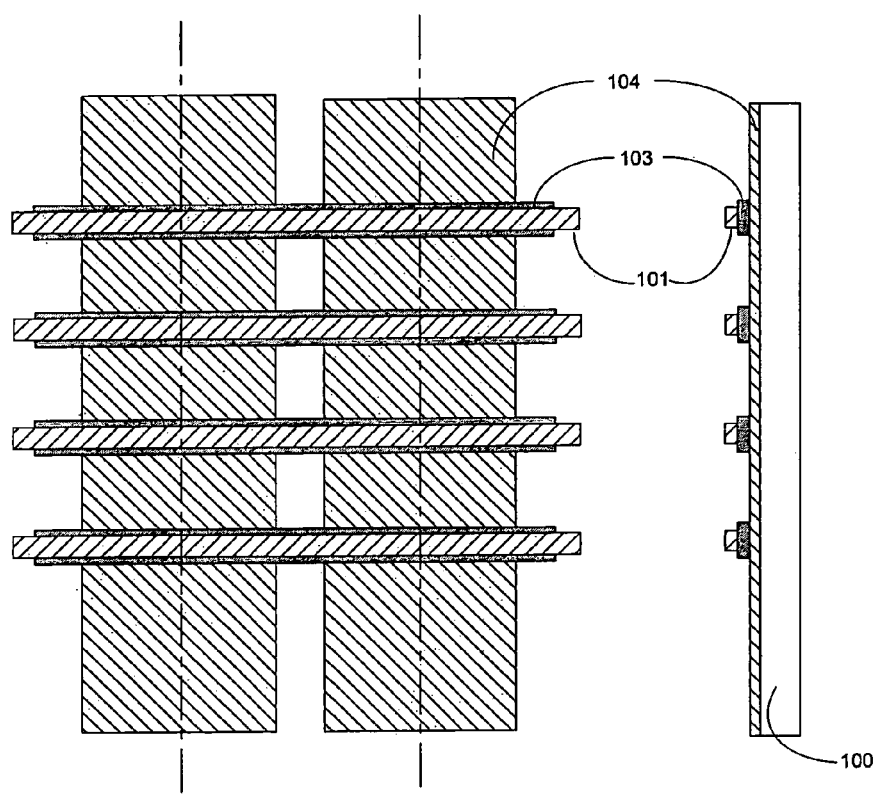
Figure 14A:
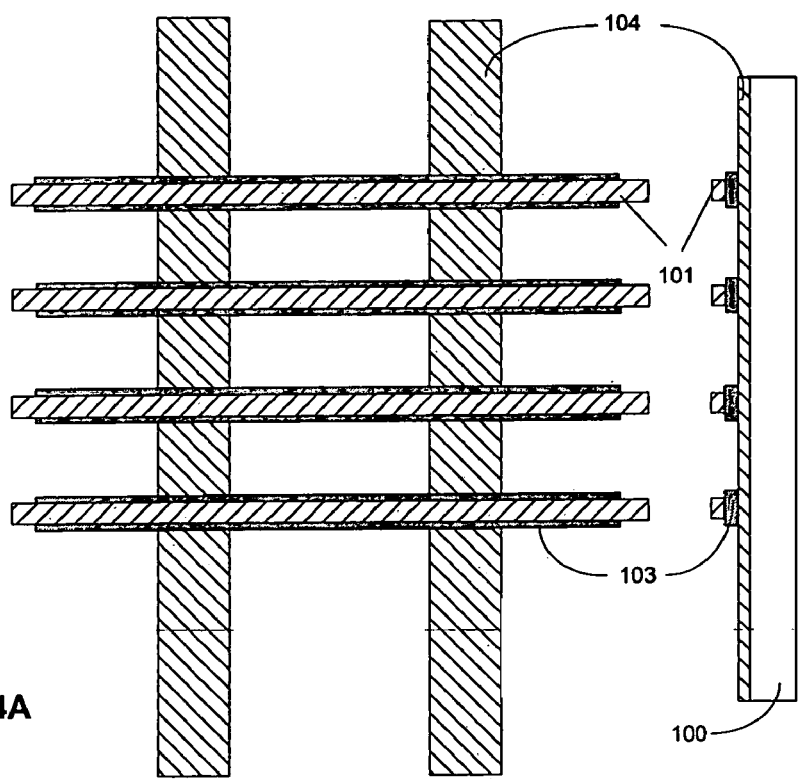
Figure 14B:
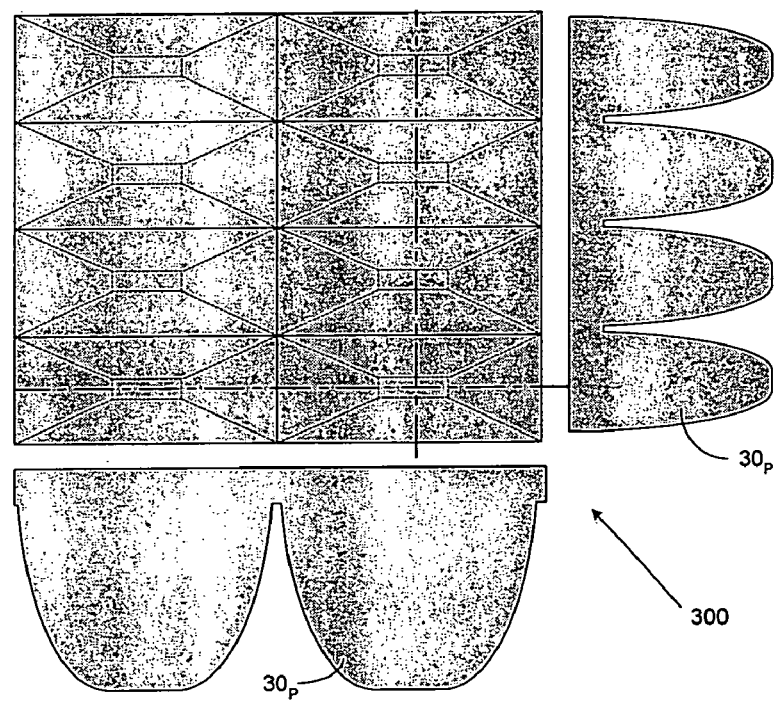

FIGS. 12 to 14 show other variants relating to the shape of the reflectors of the extraction elements;

FIG. 12B: each extraction element $30_L$ has a plane of symmetry, serves for a row of cells of the panel in FIG. 12A and is centered on a transparent electrode row 101 of this panel;

FIG. 13B: each extraction element $30_C$ has a plane of symmetry, serves for a column of cells of the panel of FIG. 13A and is centered on an opaque electrode column 104 of this panel; and FIG. 14B: each extraction element $30_P$ has an axis of symmetry centered on a cell of the panel at the intersection of a transparent row electrode 101 and an opaque column electrode 104 of the panel of FIG. 14A and essentially serves for this cell.

The two large families of light extraction elements that have just been described are, as already seen, applicable to back-emitting extraction panels, with the drawback already mentioned that the amount of light captured by the extraction layer is then less than in the previous cases of top-emitting panels, because of the thickness of the substrate; one way of avoiding this drawback is to use a substrate 100" in the form of a fiber-based plate, the fibers 106 of which are orthogonal to the principal faces of this plate and are suitable for guiding the light from one face of this plate to the other along the shortest possible optical path.

FIGS. 15 and 16 show two variants of this embodiment, in the case of an extraction layer 300 formed from reflectors 30 and in the case of an extraction layer 200 formed from microlenses 20 respectively.

The advantage of using extraction layers in the form of a single part 200, 300 with this type of substrate 100" is that they provide very good sealing and very good protection of the cells of the panel, which would be insufficiently protected from water and oxygen by the substrate alone because of its fiber-based structure, which makes it permeable to water and to oxygen; the organic materials of the electroluminescent layer 103 are in fact known to rapidly degrade under the action of water or oxygen.

In general, the extraction layer, when it is made as a single part, may advantageously serve as encapsulation layer in order to substantially improve the protection of the cells from ambient oxygen or ambient water; this advantage is particularly appreciable in the case of top-emitting panels, whether the extraction elements belong to the first and/or the second family of embodiments.

The invention has been described with reference to organic electroluminescent panels without barriers; it also applies to panels provided with barriers, such as those in FIGS. 1 and 3 described above; in the case of top-emitting panels, the height of the barriers, generally less than 10 μm, is not an impediment for the application of light extraction elements to reflectors, given the curvature of the reflectors that makes it possible to remain far from the barriers.

The two large families of light extraction elements have been described above with reference to exit interface shapes in the form of microlenses for the first family and reflective surface shapes in the form of parabolas for the second, but other geometrical shapes can be used. Both for the exit interface of the first family and the reflective surface of the second family, it is preferred to use curved surfaces that are more effective for extraction, therefore as opposed to surfaces having plane regions.

In a general variant of the invention, the light extraction means are suitable for also serving to reduce the aperture of the light emission conoscope of the panel so as to limit it to the area of the space at the front of the panel, which is specially intended for those observing the images to be displayed; the geometry of the exit interfaces 23, 33 of the extraction elements and/or that of their reflective surfaces 32 are adapted in a manner known per se in order to obtain this concentration effect.

It may be seen that, using light extraction means such as those described above, each extraction element provides an exit aperture $L_S$ very much greater than the emission aperture $L_E$ of the corresponding cell; the ratio $L_S/L_E$ is preferably around 4 when there is no concentration effect and greater than 4 when there is a collimation effect. Thanks to the invention, the actual area of emission of the electroluminescent layer in each cell can be very substantially reduced without overall losing light flux within the panel; this is because the reduction in actual emission area in each cell is compensated for by the increase in light extraction level.

The reduction in actual emission area in each cell is particularly advantageous in the case of active-matrix panels because, in this type of panel, a number of electronic components needed to drive the cells are etched and inserted into the substrate of the panel, at each cell; now, these components may be bulky and result in the actual emission area in each cell being limited; this limitation is no longer an impediment when light extraction means according to the invention are used.

FIG. 17 illustrates three adjacent cells $10_R$, $10_G$, $10_B$ of an active-matrix electroluminescent panel each comprising one electrode of the lower layer connected to a memory component 304, and the single electrode of the upper layer (not shown) formed here by a solid transparent or semitransparent conducting layer; although the electrodes of the lower layer have to be separated from one another, a single electrode may on the contrary suffice for the upper layer; the emission area of each cell is defined here by the region of overlap of the electrode of the lower layer with the single electrode of the upper layer, and not, as in the previously described cases of passive matrices, by the intersection between an electrode of the upper layer and an electrode of the lower layer; the area of the electrode of the lower layer of each cell of the active-matrix panel may advantageously be chosen so as to correspond to that of the entry interface of the extraction elements according to the invention.

The invention is particularly advantageous if the two-dimensional matrix of cells is produced by deposition methods using a shadow mask or by ink-jet printing, especially the electroluminescent layer and the upper layer of electrodes; this is because, as it is possible thanks to the invention to reduce the emission area of the cells, the distance separating the electrodes, and therefore the width of the patterns of the masks used for depositing the various layers or sublayers of the panel, can be increased; such masks with wider patterns are very much easier to position; consequently, the invention is particularly advantageous in the case of panels without barriers, for the manufacture of which it is general practice to use shadow masking methods or ink-jet printing methods.

The invention also applies to the case of electroluminescent panels whose cells are provided with photoluminescent converter elements, such as those described for example in document U.S. Pat. No. 5,121,6214; in such panels, the electroluminescent layers of all the cells emit in the same color, for example blue; placed in the red and green cells, above the electroluminescent layer, is a photoluminescent element emitting in the red and green respectively, under excitation by the blue; in a variant, an optical filtering layer may be added, especially for blue light. In the manufacture of the panels of this type, it is therefore advantageous to produce the photoluminescent elements on the extraction elements or extraction layer; for this purpose, cavities may be made at the entry interfaces of the extraction elements and photoluminescent material may be deposited in these cavities; next, as described previously, the extraction elements or the extraction layer are (is) adhesively bonded to the base electroluminescent panel.

The invention claimed is:

1. An illumination or image-display panel comprising a one-dimensional or two-dimensional matrix of organic electroluminescent cells deposited on a substrate and grouped at least into rows, said matrix of cells comprising an electroluminescent layer placed between two layers of electrode arrays, namely one called the "lower" layer on the same side as the substrate and one called the "upper" layer of transparent or semitransparent electrodes on the other side, each cell being positioned in a region of overlap between an electrode of the lower layer and an electrode of the upper layer, said panel comprising for each cell or group of cells, an optical right extraction element which itself comprises:

an entry interface optically coupled with the emissive surface of said cell or cells of the group so as to capture the rays emitted by said cell or cells;

an exit interface; and an intermediate reflective surface that has a suitable curvature so that the rays emanating from the entry interface that strike said intermediate reflective surface are sent toward the exit interface so as to have there an angle of incidence smaller than the critical angle of retraction at this exit interface in order to pass through it, wherein said extraction elements are positioned on this upper layer, wherein said optical extraction elements of the panel are made up of a single piece forming an extraction layer and wherein the extraction layer forms an encapsulation layer.

2. The panel as claimed in claim 1, wherein said reflective surface has no plane surface element.

3. The panel as claimed in claim 2, wherein said reflective surface of each extraction element has at least one plane of symmetry and in that each of the two rows of intersection of this surface with a plane perpendicular to this plane of symmetry forms a portion of a parabola or a succession of portions of parabolas so that the reflective surface forms a CPC (Compound Parabolic Concentrator).

4. The panel as claimed in claim 3, wherein, when each of said two Fines of intersection form a portion of parabola, the position of the axis and of the focus of the parabola of each line of intersection, and also the thickness L of the extraction element, are chosen so that:

this focus F lies approximately on the contour that defines said entry interface;

this axis passes approximately through this focus F and approximately through the intersection S of said plane perpendicular to the plane of symmetry with the contour of said exit interface on the opposite side from this focus with respect to said plane of symmetry, and if a' is the distance that separates this focus F from the plane of symmetry and if a is the distance that separates this point S from the plane of symmetry:

the focal length of the parabola is given approximately by $f=a'(1+a'/a)$, and the thickness L of the extraction element is given approximately by $L=(a+a') \sqrt{1-(a'/a)_2}$.

5. The panel as cl&med in claim 1, wherein, when the entry interface of each extraction element covers a group of cells, each extraction element has a plane of symmetry centered on this group of cells.

6. The panel as claimed in claim 5, wherein each cell of said group emits in the same primary color.

7. The panel as claimed in claim 1, wherein, when the entry interface of each extraction element covers a single cell, each extraction element has two planes of symmetry, the intersection of which passes through the center of this cell.

* * * * *